(12) United States Patent
Xu et al.

(10) Patent No.: US 9,048,419 B2
(45) Date of Patent: Jun. 2, 2015

(54) PIEZO DEVICES WITH AIR-SPACED CANTILEVER

(75) Inventors: Yong Xu, Troy, MI (US); Zhuo Wang, Urbana, IL (US); Qinglong Zheng, Detroit, MI (US)

(73) Assignee: WAYNE STATE UNIVERSITY, Detroit, MI (US)

( * ) Notice: Subject to any disclaimer, the term of this patent is extended or adjusted under 35 U.S.C. 154(b) by 1016 days.

(21) Appl. No.: 12/451,811

(22) PCT Filed: Jun. 2, 2008

(86) PCT No.: PCT/US2008/007029
§ 371 (c)(1),
(2), (4) Date: Jun. 28, 2010

(87) PCT Pub. No.: WO2008/150536
PCT Pub. Date: Dec. 11, 2008

(65) Prior Publication Data
US 2010/0270889 A1    Oct. 28, 2010

Related U.S. Application Data

(60) Provisional application No. 60/932,862, filed on May 31, 2007, provisional application No. 60/932,847, filed on May 31, 2007, provisional application No. 61/124,907, filed on Apr. 18, 2008.

(51) Int. Cl.
| | |
|---|---|
| *H01L 41/08* | (2006.01) |
| *H01L 41/113* | (2006.01) |
| *G01P 15/09* | (2006.01) |
| *G01P 15/12* | (2006.01) |
| *H02N 2/18* | (2006.01) |

(52) U.S. Cl.
CPC ............ *H01L 41/1136* (2013.01); *G01P 15/09* (2013.01); *G01P 15/0922* (2013.01); *G01P 15/123* (2013.01); *H02N 2/188* (2013.01)

(58) Field of Classification Search
USPC .................. 310/330, 334, 339, 329, 349, 332, 310/323.21, 370, 321, 361, 338; 73/514.34, 73/105
IPC ...................................................... H01L 41/113
See application file for complete search history.

(56) References Cited

U.S. PATENT DOCUMENTS

| | | | | |
|---|---|---|---|---|
| 4,479,385 | A * | 10/1984 | Koehler ...................... 73/514.29 |
| 5,397,904 | A * | 3/1995 | Arney et al. ..................... 257/66 |
| 2004/0093947 | A1* | 5/2004 | Brederlow et al. ............. 73/590 |
| 2005/0130360 | A1* | 6/2005 | Zhan et al. ..................... 438/197 |
| 2006/0227331 | A1* | 10/2006 | Vollmer et al. ................ 356/483 |

* cited by examiner

*Primary Examiner* — Thomas Dougherty
*Assistant Examiner* — Karen B Addison
(74) *Attorney, Agent, or Firm* — Brinks Gilson & Lione

(57) ABSTRACT

An arrangement that converts mechanical energy into electrical energy employs a base member and a cantilever member coupled thereto. The cantilever member has two piezoelectric layers with an air space therebetween. A proof mass is coupled to the cantilever member distal from the base member. The first and second piezoelectric layers are formed of lead zirconate titanate (PZT), and the output voltage of the cantilever member is proportional to the height of the air gap. A piezoresistive accelerometer that is useful for measuring mechanical vibration has a suspension beam and a piezoresistive layer be separated from the suspension beam. A method of monitoring an acoustic vibration utilizes a piezoresistive element having an air-spaced cantilever formed of a piezoelectric material in the vicinity of the system to be monitored and obtains an alternating voltage form the air-spaced cantilever of the piezoresistive element.

23 Claims, 12 Drawing Sheets

Plot of efficiency $\eta$ by $\gamma$ with different $C$ ($\alpha = 5$)

PIEZO DEVICES WITH AIR-SPACED CANTILEVER

RELATIONSHIP TO OTHER APPLICATIONS

This application is a US national stage filing under 35 U.S.C. §371 of International Application No. PCT/US2008/007029 filed on Jun. 2, 2008 and claims the benefit under 35 U.S.C. §119(e) of the filing date of U.S. Provisional Patent Application Ser. Nos. 60/932,862 (filed May 31, 2007); 60/932,847 (filed May 31, 2007); and 61/124,907 (filed Apr. 18, 2008). The disclosures in the identified United States Provisional patent applications are incorporated herein by reference.

GOVERNMENT RIGHTS

This invention was made with Government support under Grant No. 0501314 awarded by NSF. The Government has certain rights in the invention.

BACKGROUND OF THE INVENTION

1. Field of the Invention

This invention relates generally to piezoelectric devices, and more particularly, to a piezoelectric device based on air-spaced composite cantilever beams for vibration energy harvesting.

2. Description of the Prior Art

Piezo devices that are known in the art are based on conventional solid cantilevers. Since of the distance between the active layer and neutral plane is small in such known devices, their sensitivity is limited. In addition, an unacceptably large percentage of the energy applied to the cantilever is wasted to bend the non-active layers, leading to a small signal-to-noise ratio.

There is, therefore, a need in the art for piezoelectric energy harvesting devices, and piezoresistive devices, that provide improved sensitivity.

There is additionally a need for piezo devices that generate increased voltage in response to vibrations, and afford correspondingly increased signal-to-noise ratio.

SUMMARY OF THE INVENTION

The foregoing and other objects are achieved by this invention, which provides, piezo devices having air-spaced piezoelectric cantilevers. The voltage that is generated as a result of vibrations is significantly increased since the distance between the piezoelectric layer and the neutral plane is increased. In addition, the energy conversion efficiency is increased. A simplified analytical model has been developed to explain the advantages and facilitate the selection of design parameters. Additionally, finite element simulation has been performed to verify the analytical results. A prototype system has successfully been assembled and tested.

In accordance with a first apparatus aspect, there is provided piezo device having an air space cantilever arrangement.

In accordance with a specific illustrative embodiment of this first apparatus aspect of the invention, the air space cantilever arrangement is formed of first and second beams separated from one another by an air space, said first and second beams being symmetric. The first and second beams each have an equal length dimension, and are each formed of a selectable one of a piezoelectric material and a piezoresistive material.

In a further embodiment of the invention, the air space cantilever arrangement is formed of first and second beams separated from one another by an air space, and the first and second beams are asymmetric. In such an embodiment, one of the first and second beams is an active beam, and the active beam has a shorter length dimension than the other beam. In a specific illustrative embodiment of the invention, a smaller one of the asymmetric first and second beams is formed of a selectable one of a piezoelectric material and a piezoresistive material. The specific illustrative embodiment of the invention may be implemented as an accelerometer.

In a still further embodiment, an energy that is stored in a smaller one of the asymmetric first and second beams is maximized in response to the optimization of γ substantially in accordance with the relationship:

$$\gamma_0 = \frac{1}{1 + \sqrt{1 + 1/C}}$$

In one embodiment, the piezo device is an energy harvesting device, and the air space cantilever arrangement is formed of first and second beams. In this embodiment, the first and second beams are formed of a piezoelectric material. The piezoelectric material is, in some embodiments, lead zirconate titanate (PZT).

In an embodiment of the invention where the piezo device is an accelerometer device, and the air space cantilever arrangement is formed of first and second beams, the first and second beams are formed of a selectable one of a piezoelectric material and a piezoresistive material.

In a specific illustrative embodiment of the invention, the piezo device is an atomic force microscope (AFM).

In a further specific illustrative embodiment of the invention, the air space cantilever is optimized substantially in accordance with the relationship:

$$N(\alpha, \beta) = \frac{k_P}{k_S} = \frac{1}{3\alpha^2\beta} << 1$$

an arrangement for converting mechanical energy into electrical energy, the arrangement having a base member and a cantilever member coupled to the base member. The cantilever member is formed of first and second piezoelectric layers having an air space therebetween.

In one embodiment, there is provided a proof mass member coupled to the cantilever member distal from the base member.

The first and second piezoelectric layers of the cantilever member are formed, in a highly advantageous embodiment of the invention, of lead zirconate titanate (PZT). In some embodiments, the first piezoelectric layer the of the cantilever member is formed of first and second PZT elements.

The output voltage of the cantilever member is substantially proportional to α, which is responsive to the height of the air space between the first and second piezoelectric layers. The output voltage of the cantilever member corresponds substantially to:

$$V = d_{31} E_1 \frac{\alpha t}{\varepsilon_3 \varpi_n^2 l^2}(r - r^2/2) N(r) a.$$

In accordance with further apparatus aspect of the invention, there is provided a piezoresistive accelerometer having a suspension beam and a piezoresistive layer arranged to be separated from the suspension beam.

In one embodiment of this further aspect of the invention, the suspension beam is formed of silicon. Also, the piezoresistive layer is formed of silicon.

In an advantageous embodiment, the suspension beam is configured to have a larger cross-sectional area than the piezoresistive layer.

The piezoresistive layer is, in some embodiment, formed of first and second piezoresistive layer beams.

In a practical embodiment, the piezoresistive accelerometer is further provided an input voltage source coupled to the piezoresistive layer, and the piezoresistive layer produces an output voltage that corresponds substantially to the voltage of the input voltage source multiplied by a change in resistivity responsive to a vibration imparted to the piezoresistive layer, the change in resistivity is responsive to a corresponding stress in the piezoresistive layer and corresponding substantially to:

$$\frac{\Delta R}{R} = \frac{\int_0^l dx \int_{y_2-0.5t_2}^{y_2+0.5t_2} \Delta \rho dy}{\int_0^l dx \int_{y_2-0.5t_2}^{y_2+0.5t_2} \rho dy} = \frac{\pi_l E_2 (y_2 - y_c) N_l a}{\omega_n^2 l^2}.$$

In accordance with a still further apparatus aspect of the invention, there is provided an arrangement for converting mechanical energy into electrical energy. The arrangement is provided with a base member. Additionally, there are provided a lower beam coupled at one end thereof to the base member and an upper beam, also coupled at one end thereof to the base member The upper beam has a smaller cross-sectional area than the lower beam and is separated from the lower beam by an air gap.

In one embodiment, there is provided a proof mass coupled to the upper beam distal from the base member.

The upper beam is formed of silicon in some embodiments. Also, in other embodiments, the upper beam is formed of PZT.

The upper beam is configured in some embodiments as first and second pieroresistive or piezoelectric beam elements.

In a practical embodiment, a rectifier is provided for converting an AC signal obtained from the upper beam to a corresponding DC signal.

In accordance with a method aspect of the invention, there is provided a method of monitoring an acoustic vibration issued by a system to be monitored. The method includes the steps of:

installing an element having an air-spaced cantilever formed of a piezoelectric or piezoelectric material in the vicinity of the system to be monitored;

obtaining an alternating voltage from the air-spaced cantilever of the piezoresistive element, the alternating voltage being responsive to the acoustic vibration issued by the system to be monitored.

The system to be monitored can be a machine or a biological being, as will be described hereinbelow.

BRIEF DESCRIPTION OF THE DRAWING

Comprehension of the invention is facilitated by reading the following detailed description, in conjunction with the annexed drawing, in which.

DETAILED DESCRIPTION

Vibration Energy Harvesting Device with Air-Spaced Piezoelectric Cantilevers

Figure 1:
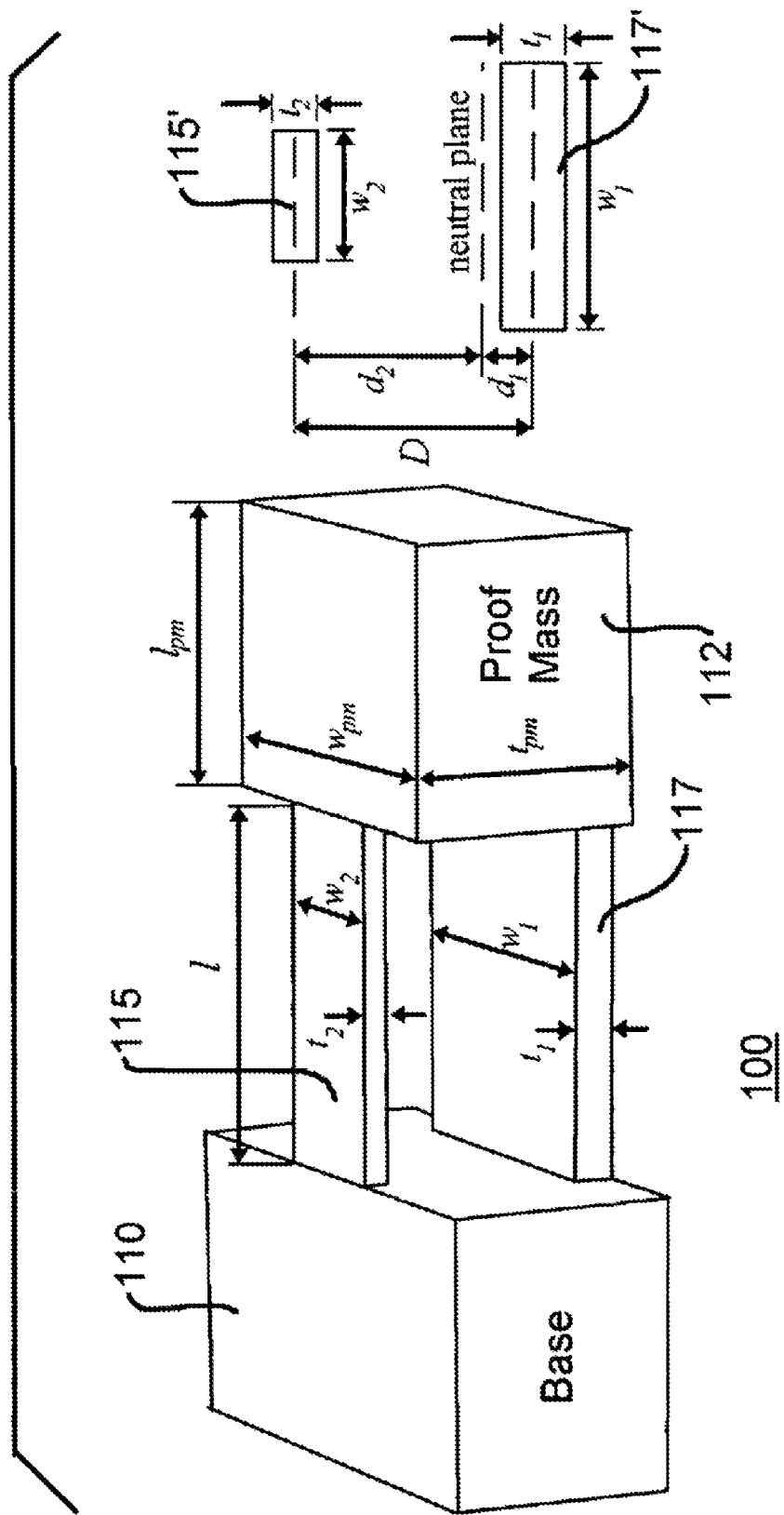
FIG. 1 is a simplified schematic representation of a specific illustrative energy harvesting embodiment of the invention showing various dimensional characteristics that are useful in analyzing the operation of the inventive arrangement, specifically that the voltage generated is proportional to the height of the air gap.

FIG. 1 is a simplified schematic representation of a vibration energy harvesting device 100 based on air-spaced piezoelectric cantilevers constructed in accordance with the present invention. In this embodiment of the invention, the voltage generated is proportional to the height of the air gap. An upper layer (beam) 115 and a bottom layer (beam) 117 are made, in this specific illustrative embodiment of the invention, of piezoelectric materials such as PZT (Lead Zirconate Titanate). Referring to upper layer 115, the thickness is $t_2$, width is $w_2$, and the length between a base 110 and a proof mass 112 is 1. With respect to bottom layer 117, the thickness is $t_1$, width is $w_1$, and the length between a base 110 and a proof mass 112 is 1. In some embodiments, however, particularly in an asymmetric arrangement, bottom layer 117 can be longer than upper layer 115. In this arrangement, bottom layer 117 is referred to as the "suspension beam," and upper layer 115 is referred to as the "active beam." When the dimensions of the upper and bottom beams are same, air-spaced cantilever arrangement is deemed to be "symmetric." Otherwise, the arrangement is an asymmetric air-spaced cantilever.

Figure 2:
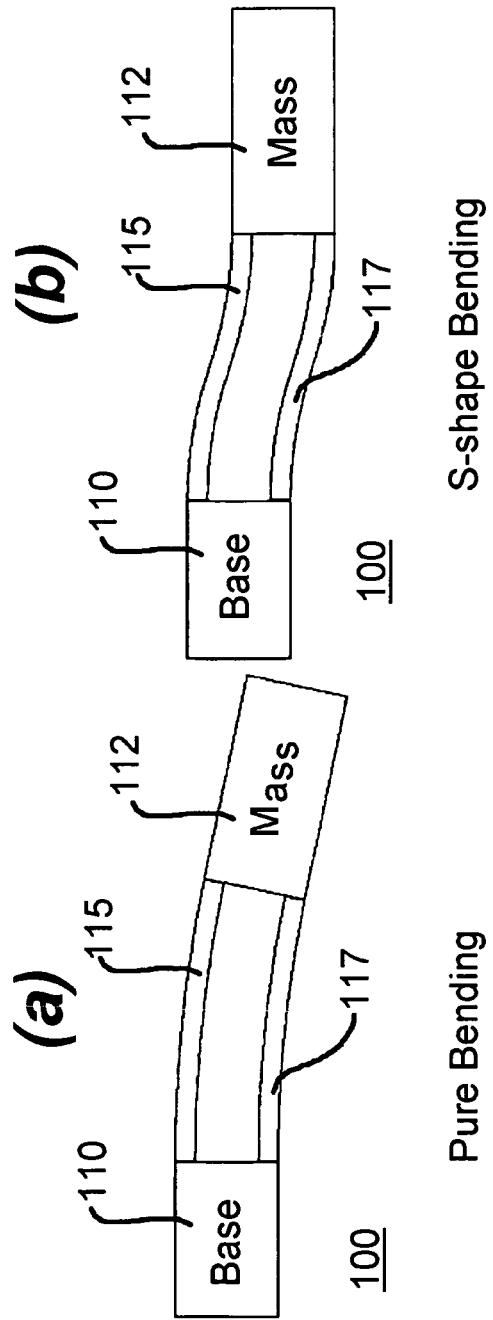
FIGS. 2(a) and 2(b) are simplified schematic representations of the air space cantilever arrangement shown experiencing pure bending and S-shape bending, respectively.

FIGS. 2(a) and 2(b) are simplified schematic representations of the air space cantilever arrangement, illustratively that of FIG. 1, shown to be experiencing pure bending in FIG. 2(a) and S-shape bending in FIG. 2(b). The distances from neutral plane to bottom and top beams are d1 and d2, respectively, and the distance between top and bottom layer is D (D=$d_1$+$d_2$). $E_1$, $E_2$, $I_1$=$w_1 t_1^2/12$, $I_2$=$w_2 t_2^2/12$, $A_1$ and $A_2$ are Young's moduli, moments of inertia and section areas of bottom and top beams, respectively.

Assuming for the moment that the device shown in FIG. 1 is configured for the application fo a vibration energy harvesting device. In such a case, the small upper beam is made from piezoelectric material (asymmetric case) or both beams are piezoelectric (symmetric case). For other sensing applications, piezoresistive material can be used to form one or two the beams of the air-spaced cantilever. When there is present an acceleration in the vertical direction, the proof mass will displace accordingly and the beams will be subject to deformation. Unlike a conventional cantilever, the deformation of the air-spaced cantilever should be considered in both pure bending and S-shaping modes because the plane assumption would not be valid.

In order to derive an analytical model for the air-spaced cantilever, one begins from decomposition of the shear forces and bending moments into pure bending and S-shape modes. It is noted that: (1) for pure bending, the composite beams are subject only to a constant bending moment without any shearing force, and (2) for S-shape bending, the proof mass will remain horizontal after deformation (meaning that the bending moment at the middle of the beam is zero), it is straightforward to decompose the total shearing forces and bending moments to pure bending and S-shape bending modes as shown in FIGS. 2(a) and 2(b). Note that subscripts P and S are used herein to represent parameters of pure bending and S-shape bending, respectively. This symbol convention is used throughout this disclosure. The bending rigidities for pure bending and S-shape bending $R_P$ and $R_S$ are given by:

$$R_P = E_1(I_1 + A_1 d_1^2) + E_2(I_2 + A_2 d_2^2) \quad (1)$$

$$R_S = E_1 I_1 + E_2 I_2 \quad (2)$$

Then the spring constants for the two modes are:

$$k_P = \frac{4R_P}{l^3} \frac{1}{\alpha^2 \beta} \quad (3)$$

$$k_S = \frac{12 R_S}{l^3} \quad (4)$$

where $\alpha$=$(l+l_{pm})/l$ and $\beta$=$R_S/R_P$. The total effective spring constant can be expressed as:

$$k_E = \left(\frac{1}{k_P} + \frac{1}{k_S}\right)^{-1} = \frac{12 R_S}{l^3} \frac{1}{3\alpha^2 \beta + 1} \quad (5)$$

Based on the Rayleigh-Ritz method, the resonant frequency is:

$$f_0' = \frac{1}{2\pi} \sqrt{\frac{R_S}{ml^3} \frac{12(3\alpha^2 \beta + 1)}{(3\alpha^2 \beta + 1)^2 + 3\alpha^2 \beta^2 (\alpha - 1)^2}} \quad (6)$$

The normal strain experienced by the upper beam is:

$$\varepsilon_2 = \frac{ma(l + l_{pm}) d_2}{2 R_P} \quad (7)$$

It can be observed that the normal strain of the top beam is proportional to $d_2$, which is approximately equal to the gap between the top and bottom beams (for asymmetric case) or the half of the air gap (for symmetric case). Therefore, the advantage of using air-spaced cantilever can be clearly seen. Also note that the normal strain of the top beam is only affected by the pure bending. The strains due to S-shape bending are cancelled when integrating across the thickness of the beam. Therefore, S-shape bending should be minimized.

It is worth noting that Eqs. (1)-(7) are valid for both, symmetric and asymmetric air-spaced cantilevers.

From energy point of view, the majority of the energy applied to the cantilever should be stored in the form of normal strain in the active beam or beams since only the normal strain contributes to effective voltage generation (piezoelectric material) or resistance change (piezoresistive material). To make pure bending dominant, the spring constant of pure bending should be much smaller than that of S-shape bending. Therefore, the criterion is available to make pure bending mode dominant.

$$N(\alpha, \beta) = \frac{k_P}{k_S} = \frac{1}{3\alpha^2 \beta} << 1 \quad (8)$$

For further discussion of asymmetric case, the energy conversion efficiency is defined as the ratio of the pure-stretching/compression (normal strain) to the total mechanical energy, which can be calculated in two steps. First, the ratio from the energy stored by pure-bending mode to the total energy can readily be derived from the spring constant equations. That is:

$$\eta_1 = \frac{k_S}{K_P + k_S} = \frac{1}{1/3\alpha^2 \beta + 1} \quad (9)$$

Second, the ratio from the energy stored only by pure-stretching/compression in the top sensing layer to the energy stored by pure-bending is:

$$\eta_2 = \frac{E_2 A_2 d_2^2}{R_P} = (1 - \beta)(1 - \gamma) \quad (10)$$

where $\gamma=d_1/D$. Therefore, the total energy conversion efficiency is:

$$\eta = \eta_1\eta_2 = \frac{(1-\beta)(1-\gamma)}{1/3\alpha^2\beta + 1} \quad (11)$$

The optimal $\gamma_0$ therefore is:

$$\gamma_0 \approx \frac{1}{1+\sqrt{1+1/C}} \quad (12)$$

where $C=t_1^2/12D^2$ and $D=d_1+d_2$.
This results in the relationship:

$$\frac{d_1}{d_1+d_2} = \frac{1}{1+\sqrt{1+\frac{12(d_1+d_2)}{t_1^2}}}$$

Figure 3:
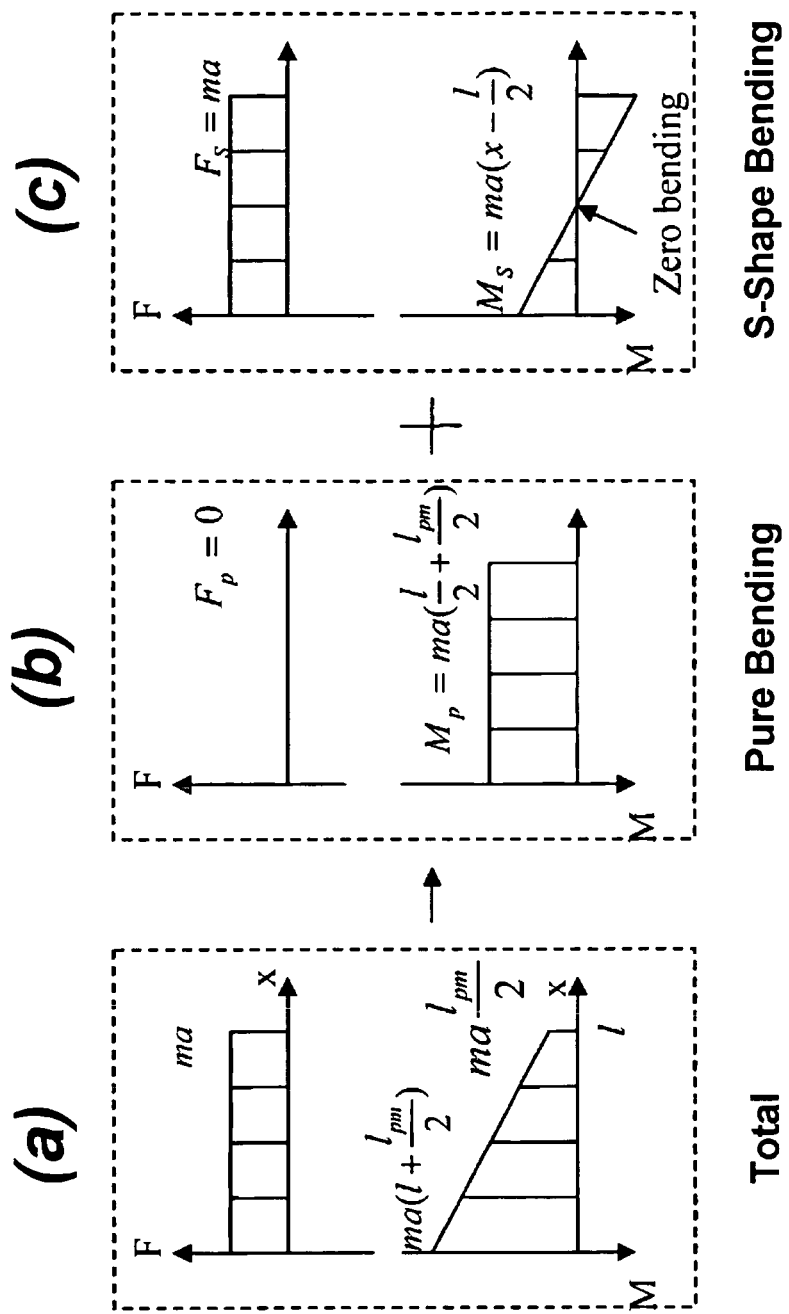
FIGS. 3(a), 3(b), and 3(c) are graphical representations of shearing forces and bending moments for the asymmetric air-spaced cantilever embodiment of FIG. 1, where m is the mass of the proof mass (the mass of the cantilever being ignored) and a is the acceleration applied.

FIGS. 3(a), 3(b), and 3(c) are graphical representations of shearing forces and bending moments for the asymmetric air-spaced cantilever embodiment of FIG. 1 where m is the mass of the proof mass (the mass of the cantilever being ignored) and a is the acceleration applied. Subscripts P and S represent parameters of pure bending and S-shape bending, respectively. It is also worth noting that the neutral plane in FIG. 1 is defined for pure bending mode.

Figure 4:
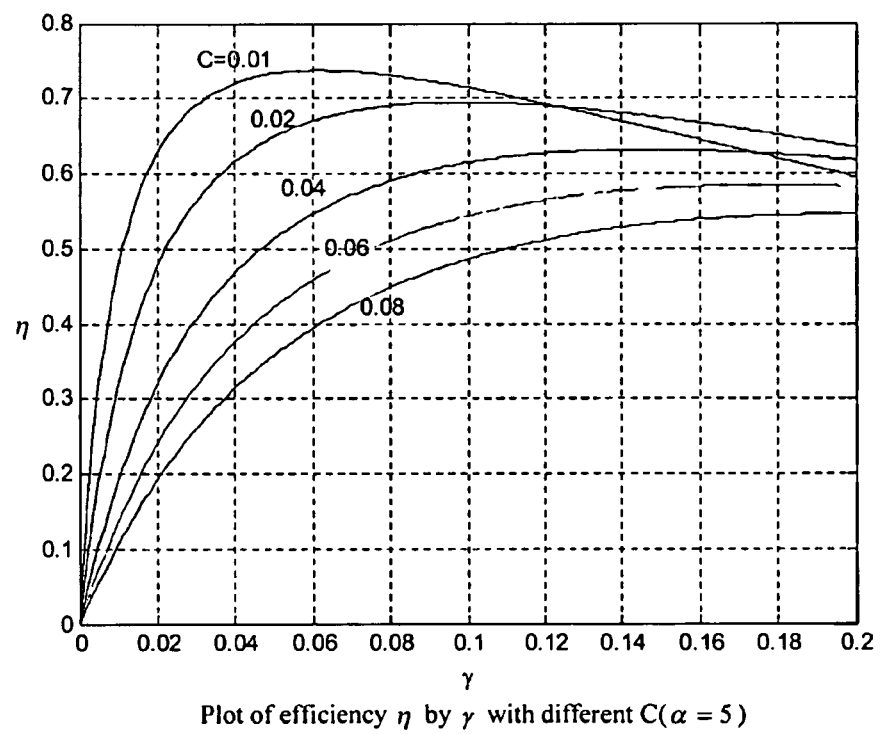
FIG. 4 is a graphical representation of efficiency η plotted against γ for different C, (α=5)

FIG. 4 is a graphical representation of efficiency $\eta$ plotted against $\gamma$ for different C, ($\alpha=5$); In this figure, forces and bending moments are applied to the cantilever in a discrete component model (F=ma). The plot of efficiency $\eta$ as a function of $\gamma$ with different C is presented in this figure. It is worth noting that for a unimorph piezoelectric cantilever (with a metal base layer), this efficiency is usually less than 36.5%. The advantage of air-spaced cantilever can clearly be observed. This advantage will help to increase the energy conversion efficiency for energy harvesting, or increase the signal-to-noise ratio for sensing applications. It is additionally worth noting that for the asymmetric design, the top beam can be shorter than bottom beam to further increase the sensitivity. Although analytical results for such case are not presented, similar advantages can be expected.

Figure 5:
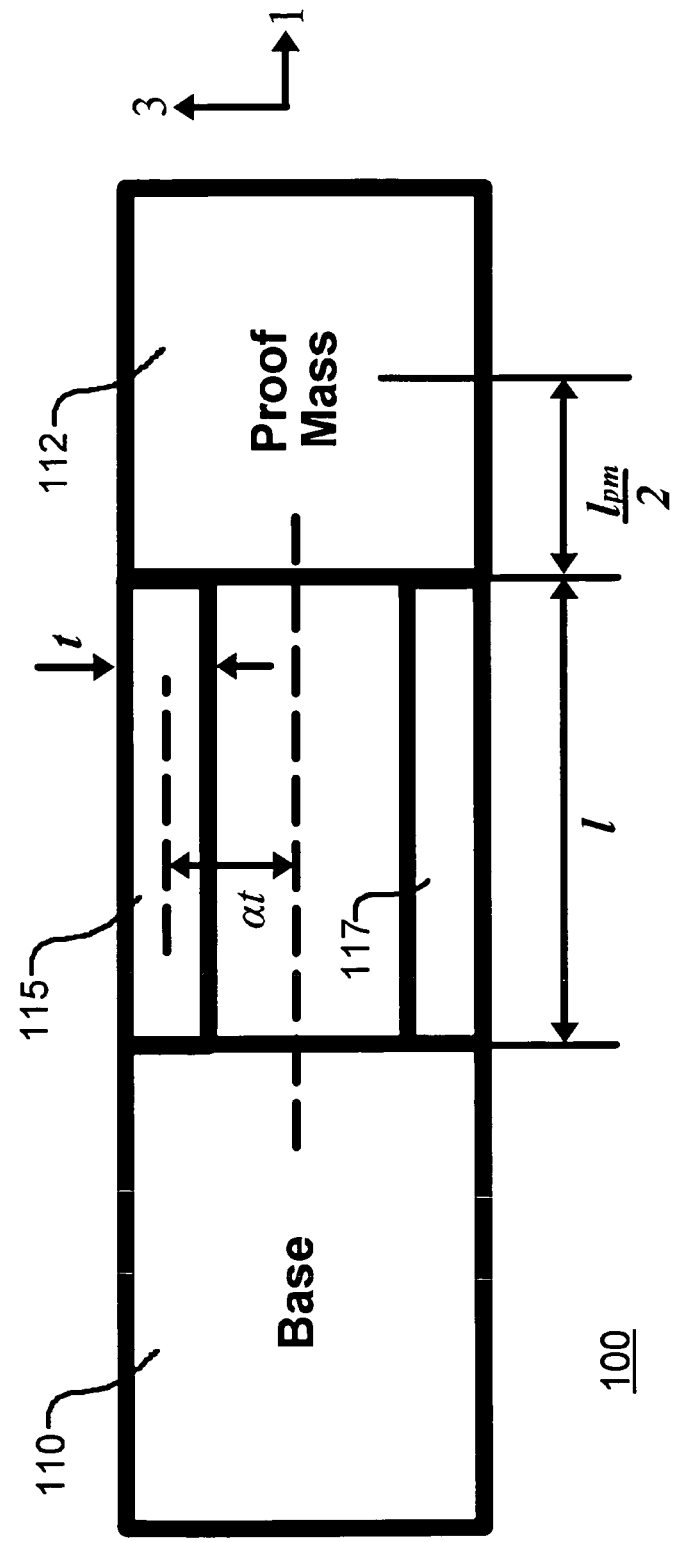
FIG. 5 is a simplified schematic representation of an embodiment with symmetric air-spaced cantilever illustrating dimensional characteristics.

FIG. 5 is a simplified schematic representation of an embodiment of the invention illustrating certain dimensional characteristics. One embodiment of the invention is a vibration energy harvesting device based on symmetric air-space cantilever shown in FIG. 4. Both top and bottom beams are made from piezoelectric material such as PZT. The output voltage appears on an individual beam is:

$$V/a = \frac{\lambda d_{31}}{\varepsilon_0\varepsilon_3} \frac{m(l+l_{pm})d_2 E_2 t_2}{2R_P} \quad (13)$$

where $d_{31}$ is the piezoelectric coefficient, $\varepsilon_3$ is the relative dielectric constant of PZT in direction 3, $\varepsilon_0=8.85\times10^{-12}$ $C^2/N\cdot m^2$ is vacuum permittivity, and $\lambda=l/l_t$ ($l_t$ is the total length of the diced PZT) is a coefficient that accounts for the parasitic PZT capacitances on the base and proof mass.

Such device can also be used as an accelerometer with the output voltage given by Eq. (13) as well. For acceleration measurement, the top and bottom beams can also be made from piezoresistive material such as silicon. The resistance change of both beams can be calculated using the following equation:

$$\Delta R/R = G\in \quad (14)$$

where G is the gauge factor of the piezoelectric material and $\in$ is the average normal strain given by Eq. (7).

Figure 10:
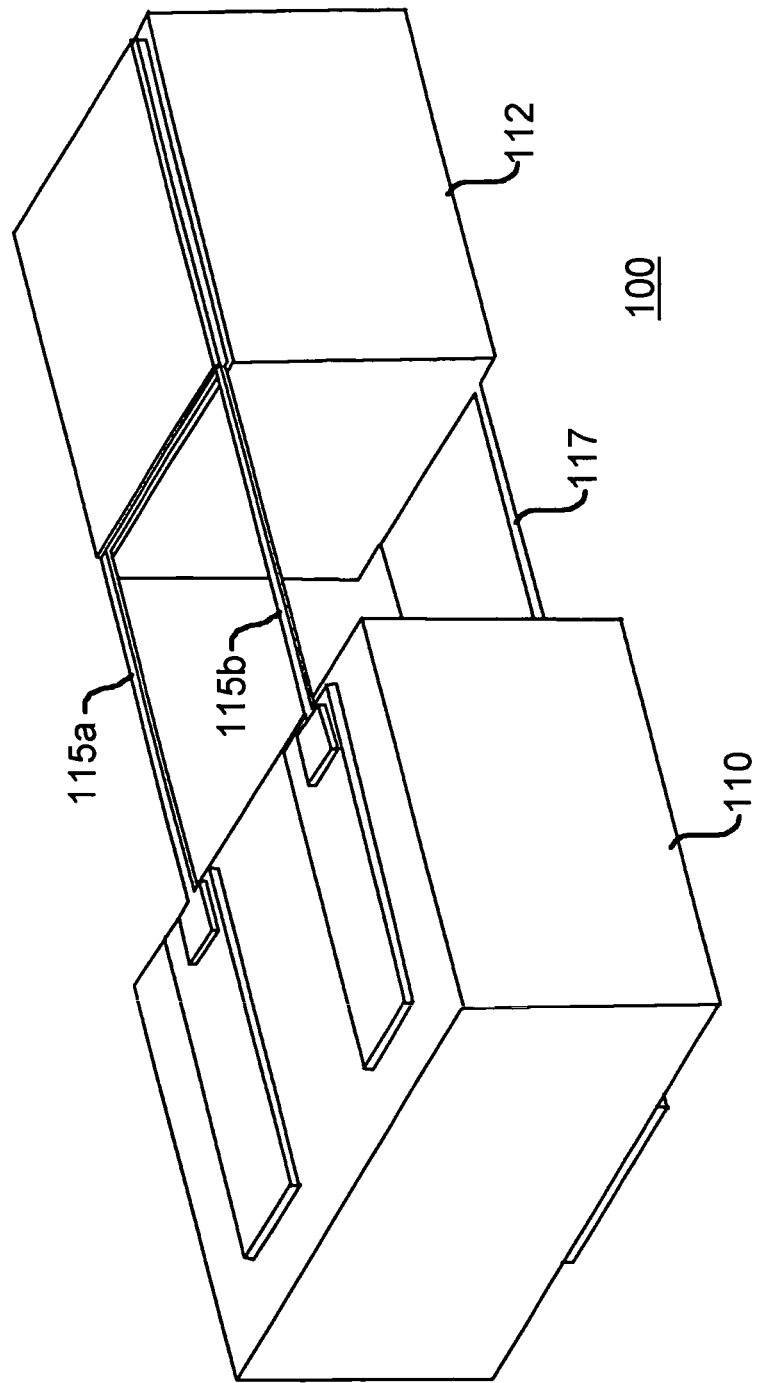
FIG. 10 is a simplified schematic isometric representation of the specific illustrative energy harvesting accelerometer embodiment of the invention with plural active beams.

Another embodiment of the invention is an accelerometer based on asymmetric air-spaced cantilever, as shown in FIG. 10. The upper small beam is made from piezoresistive material such as silicon. In order to form a signal loop, the top beam is divided into two piezoresistive sub-beams. See, for example, FIGS. 10 an 11. The resistance change is given by Eq. (14).

Figure 6:
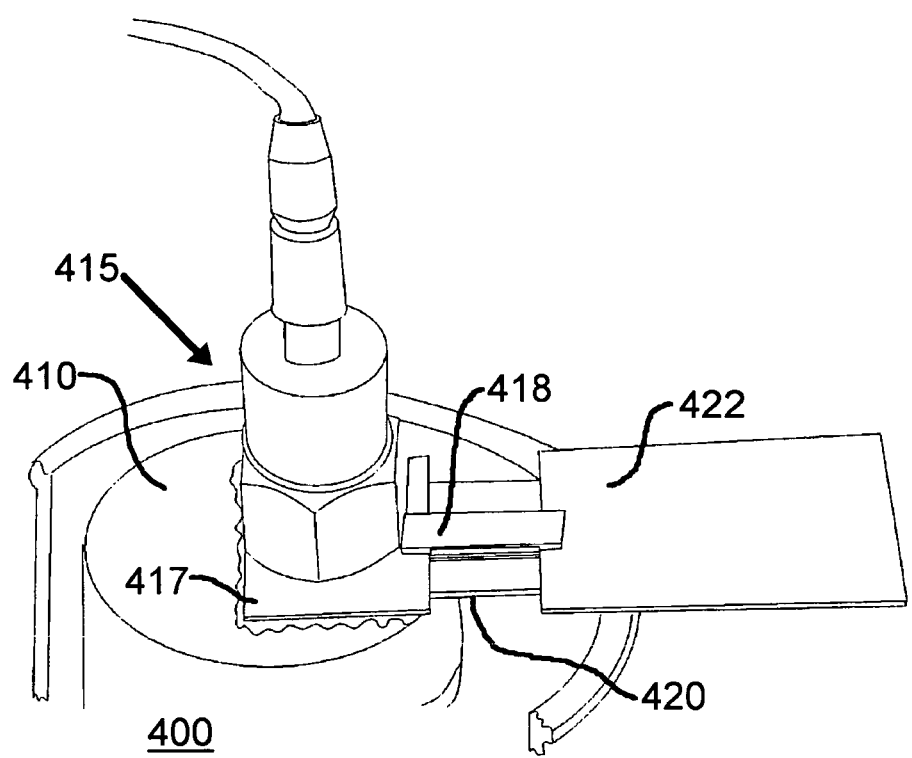
FIG. 6 is a simplified schematic perspective representation of a prototype asymmetric air-spaced cantilever embodiment of the invention mounted on a speaker and wherein a commercially available accelerometer is used to measure the acceleration.

FIG. 6 is a simplified schematic perspective representation of a prototype asymmetric air-spaced cantilever 400 energy harvesting embodiment of the invention mounted on a speaker 410 and wherein a commercially available accelerometer that is generally designated 415 is used to measure the acceleration. The speaker is used to generate mechanical vibrations. Commercially available accelerometer 415 (Model 752A13 Isomin™, Endevco, Calif., USA) was attached to a base 417 to measure the acceleration generated by the speaker. Sinusoidal signals were applied to the speaker at various frequencies. The figure illustrates prototype device 400 as having an air-spaced cantilever 418, a bottom aluminum layer 420 (15.5 mm×0.37 mm×9.8 mm), and a steel proof mass 422 (22 mm×0.35 mm×32 mm).

Figure 7:
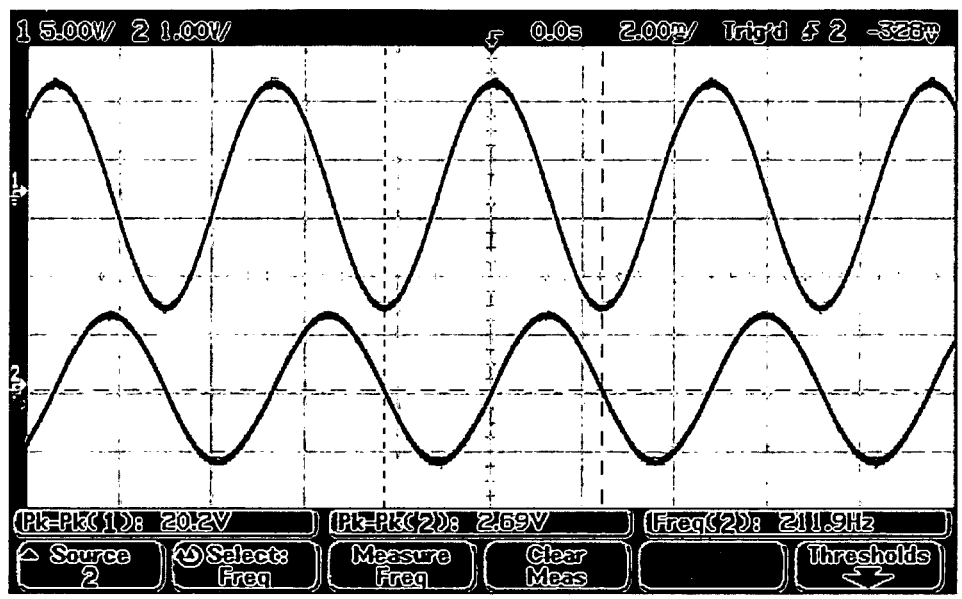
FIG. 7 is a graphical representation that compares the output voltages of a PZT sheet (top) and a commercially available accelerometer (bottom), showing a phase difference of approximately 90°.

FIG. 7 is a graphical representation that compares the output voltages of a PZT layer (top) and a commercially available accelerometer (bottom), showing a phase difference of approximately 90°. As shown in this figure, the voltages from the commercial accelerometer and the device of the present invention were simultaneously monitored by an oscilloscope.

Figure 8:
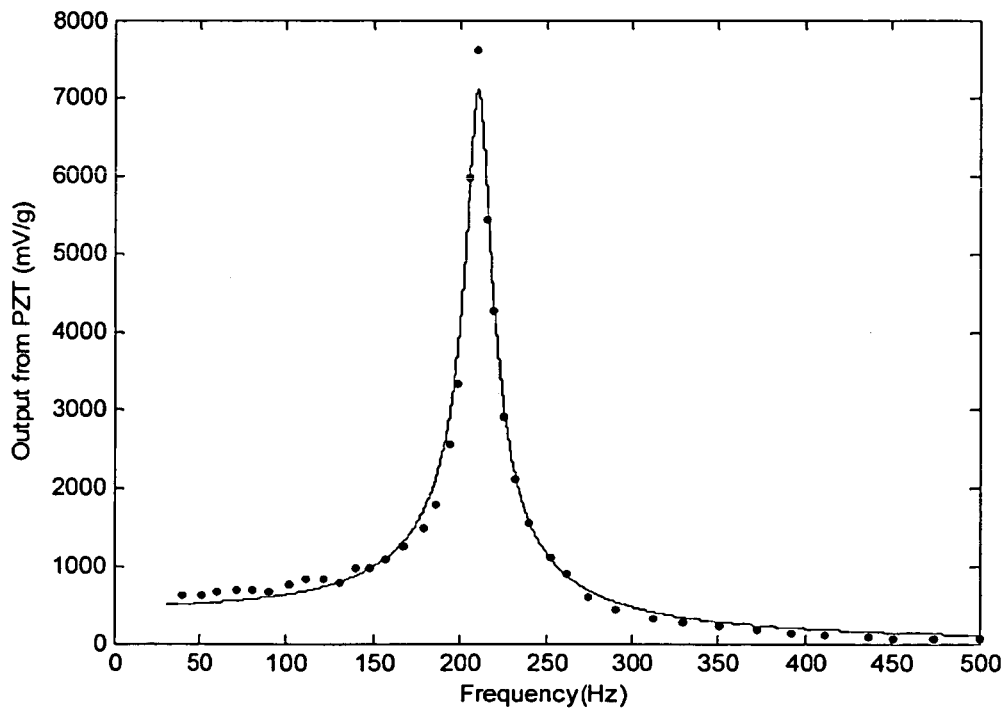
FIG. 8 is a graphical representation of the frequency response of the arrangement of FIG. 6, the fitted second order model (solid line) showing a resonant frequency of 211 Hz.

FIG. 8 is a graphical representation of the frequency response of the arrangement of FIG. 6, the fitted second order model (solid line) showing a resonant frequency of 211 Hz. The fitted second order model (solid line) shows, in this specific illustrative embodiment of the invention, a resonant frequency of 211 Hz. The resonant frequency and sensitivity from the experiment, analytical model and simulation for the prototype device are summarized in Table 1, which shows resonant frequency and voltage sensitivity for the prototype asymmetric air-spaced cantilever. ($w_1$=15.5 mm, $t_1$=0.37 mm, $w_2$=5 mm, $t_2$=0.127 mm, l=9.8 mm, $w_{pm}$=22 mm, $t_{pm}$=0.35 mm, $l_{pm}$=32 mm).

TABLE 1

|  | EXPERIMENT | ANALYTICAL | SIMULATION |
| --- | --- | --- | --- |
| Resonant Frequency $f_0$ (Hz) | 211 | 212 | 213 |
| Sensitivity (mV/g) | 706 | 760 | 721 |

As can be seen in Table 1, the resonant frequency and voltage sensitivity obtained experimentally agree well with analytical and simulation results.

Figure 9:
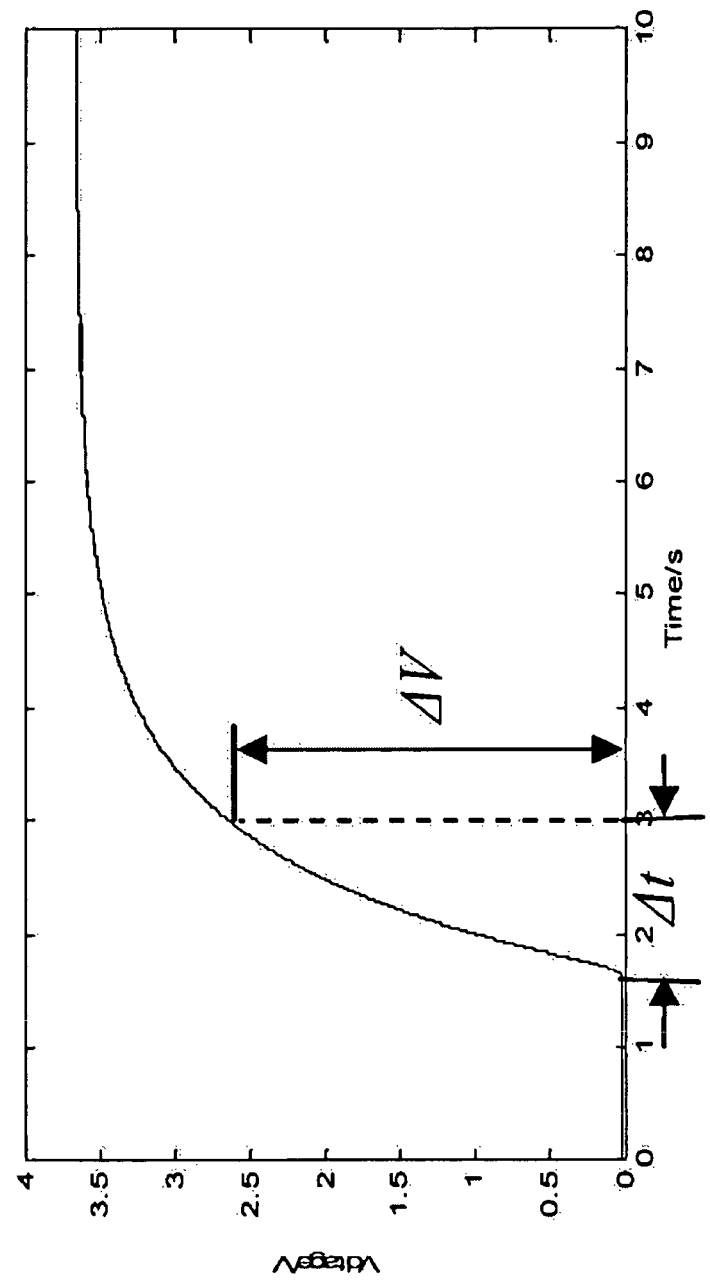
FIG. 9 is a graphical representation of a capacitor charging curve.

FIG. 9 is a graphical representation of a capacitor charging curve. A capacitor 240 (see, for example, FIG. 12) was charged by the prototype energy harvesting device discussed immediately above. Since the output voltage from the PZT is sinusoidal (see FIG. 7), it is necessary to rectify it with a diode, illustratively shown as diode bridge 230 (see FIG. 12), to charge the capacitor 240.

Figure 11:
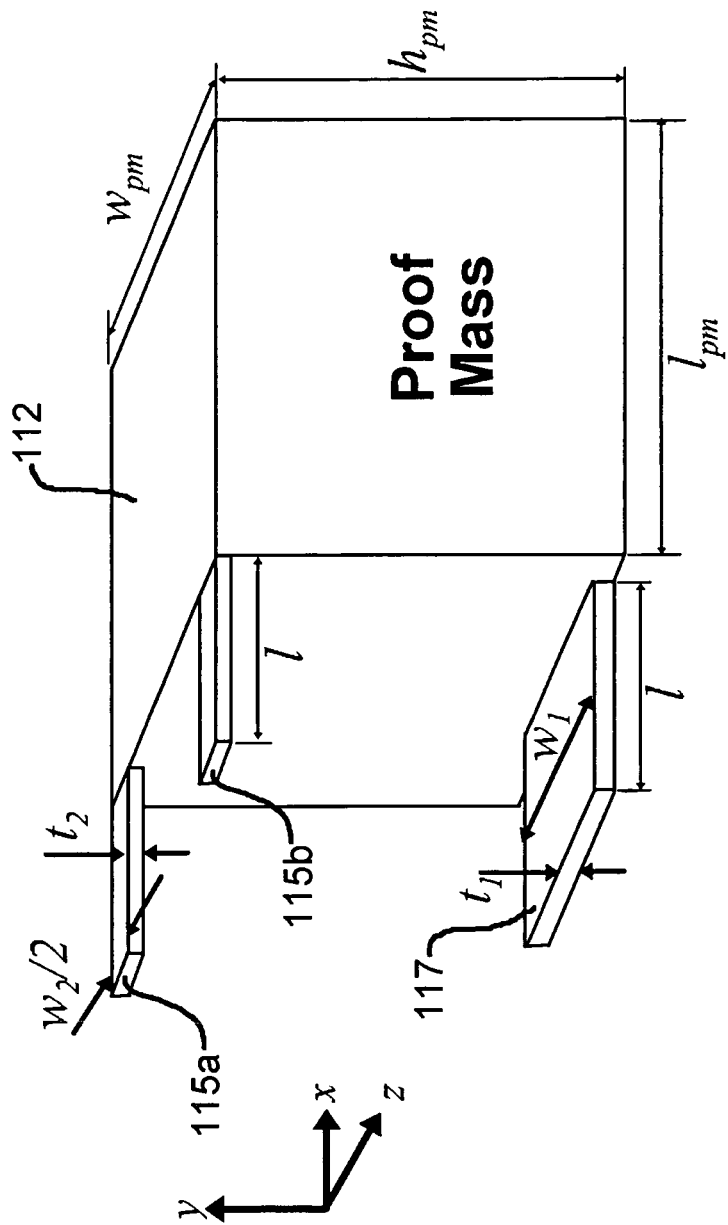
FIG. 11 is a simplified schematic isometric representation of a portion of the specific illustrative energy harvesting accelerometer embodiment of FIG. 10.

FIG. 10 is a simplified schematic isometric representation of the specific illustrative energy harvesting accelerometer embodiment of the invention. As previously discussed, in order to form a signal loop, the top beam is divided into two piezoresistive sub-beams 115a and 115b. Elements of structure that have previously been discussed are similarly designated in this figure. With reference to FIG. 11, which is a simplified schematic isometric representation of a portion of the specific illustrative energy harvesting accelerometer embodiment of FIG. 10, it is seen that the thickness t of PZT sheets 115 (shown here as PZT layer elements 115a and 115b) and 117 is 127 μm, the length l is 7.0 mm, the width w is 6.4 mm, the distance between the middle plane of the PZT sheet and the neutral plane is 220 μm (i.e., α=1.7), the length of proof mass $l_{pm}$ is 16.0 mm, and the width $w_{pm}$ is 9.2 mm.

Figure 12:
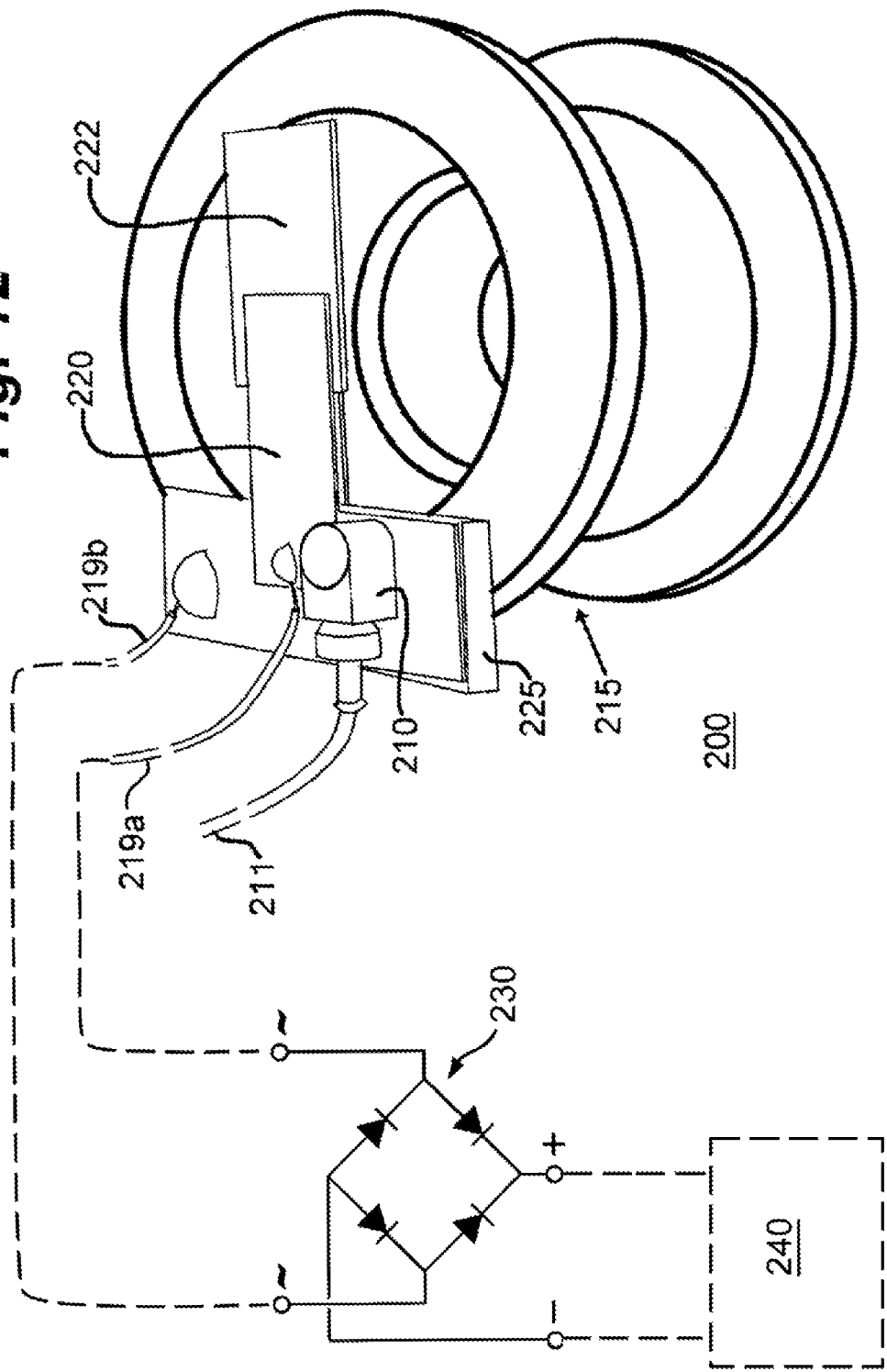
FIG. 12 is a simplified schematic perspective representation of an energy harvesting embodiment of the invention, that uses a commercially available accelerometer, disposed on the center of an audio speaker.

FIG. 12 is a simplified schematic perspective representation of an energy harvesting embodiment 200 of the invention, that uses a commercially available accelerometer 210, having an electrical output 211, disposed on the center of an audio speaker 215. The commercial accelerometer (obtained in this specific illustrative embodiment of the invention from Endevco, Calif., USA) was attached to the base to measure the acceleration generated by the speaker. Sinusoidal signals with different frequencies were applied to generate vibration at various frequencies. The electrical output of the energy harvesting system is obtained at output leads 219a and 219b, which are shown to be soldered to the energy harvesting system to receive the electrical signal issued in response to the vibration of PZT cantilever 220. A proof mass 222 is shown to be coupled to the end portion of cantilever 220, distal from a base 225.

Figure 13:
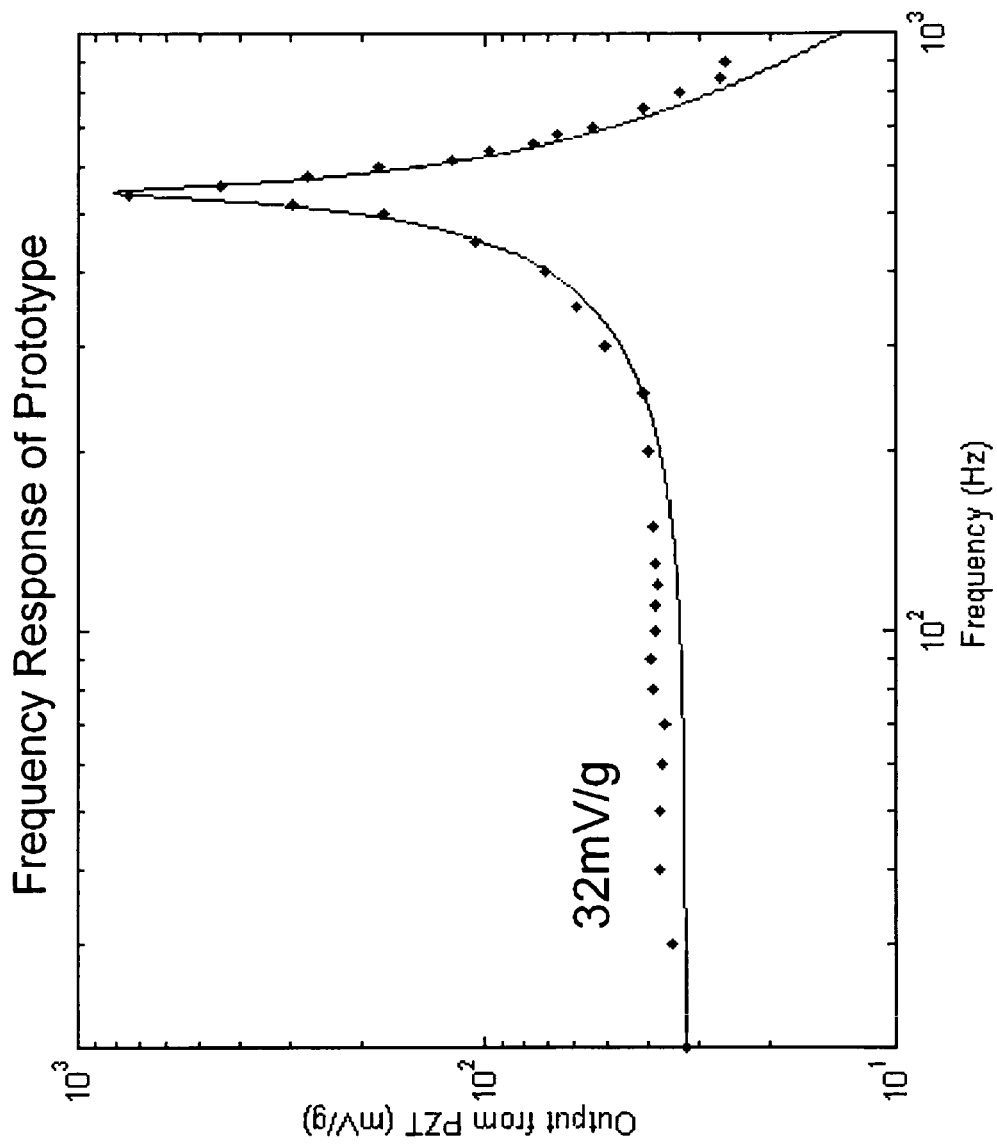
FIG. 13 is a graphical representation of the overall frequency response of the energy harvesting embodiment of the invention of FIG. 12, the dots corresponding to the plotting of experimental data and the solid curve corresponding to a theoretical fitting based on a second order model.

FIG. 13 is a graphical representation of the overall frequency response of the energy harvesting embodiment of the invention of FIG. 12, the dots corresponding to the plotting of experimental data and the solid curve corresponding to a theoretical fitting based on a second order model.

The measured resonant frequency $f_0$ was 550 Hz. However, the theoretical value based on Eq. (1) is 789 Hz. There are several reasons for this difference. First, the mass of the PZT was neglected. Second, the effective length l was longer than 7.0 mm because the PZT sheets were not perfectly glued to the edges of the base and proof mass. Third, the rigidity of aluminum plates, which was comparable to PZT sheets, was assumed to be infinitely large. The more important reason is probably that the shape of the cantilever under deflection deviated from the assumed function. A finite element model was developed and showed a more accurate resonant frequency of 589 Hz.

Analysis

If the mass of the PZT beams and the bending of the proof mass are neglected, the natural frequency can be estimated using the Rayleigh-Ritz method:

$$\omega_n^2 = \frac{2E_1 I r^2 N(r)}{m l^3} \quad (15)$$

where $E_1$, is the Young's modulus of the PZT in direction 1, m is the mass of the proof mass:

$$N(r) = \frac{36 - 36r + 12r^3}{48 - 108r + 99r^2 - 42r^3 + 7r^4} \quad (16)$$

and I is the moment of inertia given by:

$$I = \frac{wt^3}{12} + (\alpha t)^2 wt = \left(\frac{1}{12} + \alpha^2\right) wt^3 \quad (17)$$

The spring constant k is then given by:

$$k = \frac{2E_1 I r^2 N(r)}{l^3} \quad (18)$$

If the acceleration of the vibration is α, the average normal mechanical stress s experienced by the PZT is:

$$s = E_1 \frac{\alpha t}{\omega_n^2 l^2} (r - r^2)/2) N(r) a. \quad (19)$$

$$r = \frac{l}{l + l_{pm}/2} \quad (20)$$

Then the output voltage is:

$$V = d_{31} E_1 \frac{\alpha t^2}{\varepsilon_2 \varepsilon_0 \omega_n^2 l^2} (r - r^2/2) N(r) a, \quad (21)$$

where $\varepsilon_3$ is the dielectric constant of PZT in direction 3, $d_{31}$ is the piezoelectric constant. It is therefore obvious that the voltage generated is proportional to α. For conventional PZT bimorph, α is 0.5. For the present inventive air-spaced design, α can be very large, e.g., 10. Therefore the voltage generated of this new design can be orders of magnitude higher. As noted previously, this is a significant feature.

Piezoresistive Accelerometer

In accordance with a further aspect of the invention, there is provided an ultra-sensitive piezoresistive accelerometer. Unlike traditional piezoresistive accelerometer arrangements where the piezoresistor directly lies directly on the surface of the suspension beam, the present inventive design employs a decoupled piezoresistive layer. This innovative design enables the majority of the strain energy to be stored in the piezoresistive layer and therefore significantly increases the signal to noise ratio. Methods of selecting appropriate parameters to optimize the design are included within the scope of the present invention.

Unlike a traditional piezoresistive accelerometer where the piezoresistor directly lies on the surface of the suspension beam, the present design employs a decoupled piezoresistive layer. Compared with the existing accelerometers, a significant advantage of the present design is that the sensitivity and hence signal-to-noise ratio are significantly increased. Such accelerometers are useful in automotive, consumer, industrial, military, and biomedical applications. In addition, and by way of example, the present invention is useful in the fabrication of general purpose accelerometers, and is particularly useful for respiratory sound monitoring.

Continuous monitoring of respiratory sounds can provide vital physiological and pathological information for various medical applications. The dominant method to measure respiratory sounds is based on the stethoscope, comprising a bell-shape air chamber and a microphone to pick up the sound signal. However the stethoscope has a number of limitations and is not suitable for continuous respiratory sound monitoring. For instance, the stethoscope is bulky due to the air chamber. Therefore it is difficult to be body-worn or applied to obstructed auscultation sites.

Accelerometers have also been used to monitor lung sounds. Compared with the standard stethoscope, the accelerometer is in direct contact with the skin and does not need an air chamber to couple the acoustic signal. Therefore the accelerometer is more appropriate for continuous respiratory sound monitoring. However, the accelerometer needs to be much more sensitive since there is no air chamber to amplify the signal. The present invention is directed to the design and optimization of a novel ultra-sensitive piezoresistive accelerometer. As will hereinafter be shown, in the present optimized design almost 100% of the strain energy is utilized for the piezoresistive sensing and in this sense the performance of the piezoresistive accelerometer already reaches the theoretical limit.

Compared with the traditional designs with the same proof mass and bandwidth, the present invention affords significant advantages in both, the sensitivity and the minimum detectable acceleration.

Analytical Modeling

The structure of the new accelerometer is schematically shown in FIG. 10. The suspension beam of the accelerometer consists of one top layer and one bottom layer separated by an air gap. The top layer is the piezoresistive layer made of silicon and usually consists of two beams. The bottom layer is a mechanical layer that also can be made of silicon. This layer has much larger cross sectional area than the top one. These two layers can be considered as a laminated composite cantilever if one considers the air gap as one of the layers. The modeling of such a laminated cantilever is based on the mechanics of materials. For present purposes, 1 is assumed to be the length of the length of the laminated cantilever, $E_l$, $w_l$, $t_l$, and $y_l$ are the Young's modulus, width, thickness and Y coordinate of geometry center of the laminated cantilever, respectively, of the $i^{th}$ layer, and $l_{pm}$, $w_{pm}$, and $h_{pm}$ and m are the length, width, thickness and mass of the proof mass, respectively.

The resistance change is obtained by calculating the average stress:

$$\frac{\Delta R}{R} = \frac{\int_0^l dx \int_{y_2-0.5t_2}^{y_2+0.5t_2} \Delta\rho dy}{\int_0^l dx \int_{y_2-0.5t_2}^{y_2+0.5t_2} \rho dy} = \frac{\pi_l E_2 (y_2 - y_c) N_l a}{\omega_n^2 l^2}, \quad (22)$$

where the resistivity change $\Delta\rho = \pi_l \sigma_x \rho$ and the dimensionless factor $N_l$ is defined as $N_l = (r-r^2)/2)N(r)$. The piezoresistance coefficient $\pi_l$ is a function of temperature and the doping concentration.

Although the invention has been described in terms of specific embodiments and applications, persons skilled in the art may, in light of this teaching, generate additional embodiments without exceeding the scope or departing from the spirit of the invention described and claimed herein. Accordingly, it is to be understood that the drawing and description in this disclosure are proffered to facilitate comprehension of the invention, and should not be construed to limit the scope thereof.

What is claimed is:

1. A piezo device comprising an air space cantilever arrangement,
    wherein the air space cantilever arrangement includes two first beams and one second beam that are straight and parallel to each other and separated from one another by spaces, the piezo device further comprising a mounted base coupled to a first end of each of the first and second beams and a proof mass coupled to a second end of each of the first and second beams, the second end being opposite the first end, wherein the proof mass is configured to oscillate in an oscillation plane relative to the base upon excitation and to bend the first and second beams during oscillation, wherein the first beams are offset from each other in a direction perpendicular to the oscillation plane.

2. The piezo device of claim 1, wherein the first beams and the second beam each have an equal length dimension.

3. The piezo device of claim 1, wherein the first and second beams are asymmetric.

4. The piezo device of claim 3, wherein the first beams are active beams, the active beams having a shorter length dimension than the other beam.

5. The piezo device of claim 3, wherein the first beams are formed of a selectable one of a piezoelectric material and a piezoresistive material.

6. The piezo device of claim 5, wherein the piezo device is an accelerometer.

7. The piezo device of claim 1, wherein the piezo device is an accelerometer device, the first and second beams being formed of a selectable one of a piezoelectric material and a piezoresistive material.

8. The piezo device of claim 1, wherein the piezo device is an atomic force microscope (AFM).

9. The piezo device of claim 1, wherein a ratio of spring constants of the air space cantilever fulfills the relationship:

$$\frac{k_p}{k_s} \ll 1,$$

with
$k_p$ being the spring constant for pure bending of the cantilever and $k_s$ being the spring constant for S-shape bending of the cantilever.

10. An energy-harvesting device comprising a piezo having an air space cantilever arrangement,
    wherein the air space cantilever arrangement is formed of first and second beams that are straight and parallel to each other and separated from one another by an air space, the piezo device further comprising a mounted base coupled to a first end of each of the first and second beams and a proof mass coupled to a second end of each of the first and second beams, the second end being opposite the first end, wherein the proof mass is configured to oscillate relative to the base upon excitation and to bend the first and second beams during oscillation, the first and second beams being formed of a piezoelectric material,
    the piezo device further comprising a rectifier bridge connecting each of the first and second beams to an energy storage device.

11. The energy harvesting device of claim 10, wherein the piezoelectric material is lead zirconate titanate (PZT).

12. The arrangement of claim 10, wherein the output voltage of the cantilever member is positively correlated with α.

13. A piezoresistive accelerometer comprising:
    a base member;
    a suspension beam;
    a piezoresistive layer forming two parallel beams arranged spatially separated from the suspension beam and extending parallel thereto, both the suspension beam and the piezoresistive layer coupled at a first end to the base member; and a proof mass coupled to a second end of each of the suspension beam and the piezoresistive layer, the second end being opposite the first end, wherein the proof mass is configured to oscillate relative to the base upon excitation and to bend the piezoresistive layer member during oscillation.

14. The piezoresistive accelerometer of claim 13, wherein the suspension beam is formed of silicon.

15. The piezoresistive accelerometer of claim 13, wherein the piezoresistive layer is formed of silicon.

16. The piezoresistive accelerometer of claim 13, wherein the suspension beam has a larger cross-sectional area than the piezoresistive layer.

17. The piezoresistive accelerometer of claim 13, wherein the piezoresistive layer comprises first and second piezoresistive layer elements to form first and second piezoresistive layer beams.

18. An arrangement for converting mechanical energy into electrical energy, the arrangement comprising:

a base member;

a lower beam coupled at a first end thereof to the base member;

an upper beam, coupled at a first end thereof to the base member, the upper beam having a smaller cross-sectional area than the lower beam and being separated from the lower beam by an air gap;

an oscillating proof mass coupled to the upper beam at a second end thereof opposite the first end; and a rectifier bridge connecting each of the first and second beams to an energy storage device.

19. The arrangement of claim 18, wherein the upper beam is formed of silicon.

20. The arrangement of claim 18, wherein the upper beam is formed of lead zirconate titanate (PZT).

21. The arrangement of claim 18, wherein the upper beam is configured as first and second piezoresistive beam elements.

22. The arrangement of claim 18, wherein there is further provided a rectifier for converting an AC signal obtained from the upper beam to a corresponding DC signal.

23. A piezo device comprising:

a base member;

a first beam coupled at a first end thereof to the base member;

a second beam, coupled at a first end thereof to the base member, the second beam having a smaller cross-sectional area than the first beam and being separated from the first beam by a gap, the first beam having a thickness $t_1$;

the second and first beam having dimensions fulfilling the relationship:

$$\frac{d_1}{d_1 + d_2} = \frac{1}{1 + \sqrt{1 + \frac{12(d_1 + d_2)^2}{t_1^2}}},$$

with $d_1$ being the distance of the first beam to a neutral plane between the second beam and the first beam, and $d_2$ being the distance of the second beam to the neutral plane.

* * * * *